(12) United States Patent
Roy et al.

(10) Patent No.: US 7,728,278 B2
(45) Date of Patent: Jun. 1, 2010

(54) PHOTOSENSITIVE CELL WITH LIGHT GUIDE

(75) Inventors: Francois Roy, Seyssins (FR); Thomas Girault, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 83 days.

(21) Appl. No.: 11/605,847

(22) Filed: Nov. 28, 2006

(65) Prior Publication Data
US 2007/0145246 A1    Jun. 28, 2007

(30) Foreign Application Priority Data
Nov. 30, 2005   (FR) ................................ 05 12155

(51) Int. Cl.
*G02B 27/10*      (2006.01)
(52) U.S. Cl. .................... 250/214.1; 257/432; 250/226; 250/208.1; 348/340
(58) Field of Classification Search .............. 250/208.1, 250/226; 257/292, 396, 446, 461, 233
See application file for complete search history.

(56) References Cited

U.S. PATENT DOCUMENTS 6,366,365 B1    4/2002    Williamson 6,858,828 B2    2/2005    Roy et al.
7,119,321 B2 *  10/2006   Quinlan ................... 250/214.1
2005/0001146 A1 * 1/2005  Quinlan ................... 250/214.1

FOREIGN PATENT DOCUMENTS

EP        1 367 650 A1     12/2003
WO       WO 99/46618       9/1999

OTHER PUBLICATIONS

T. H. Hsu et al., "Color Mixing Improvement of CMOS Image Sensor with Air-Gap-Guard Ring in Deep-Submicrometer CMOS Technology," IEEE Electron Device Letters, vol. 26, No. 5, May 2005, pp. 301-303.

* cited by examiner

*Primary Examiner*—Georgia Y Epps
*Assistant Examiner*—Tony Ko (57) ABSTRACT

An integrated circuit having a photosensitive cell with an entry face, a photosensitive element and at least two elements forming a light guide and placed between the entry face and the photosensitive element. The second element is located between the first element and the entry face such that the two elements guide the light coming from the entry face onto the photosensitive element and each element forms a light guide. The inner volume has a first surface located on the same side as the photosensitive element, a second surface located on the same side as the entry face, and a lateral surface joining said first surface to said second surface and separating the inner volume from the outer volume. The first surface of the inner volume of the second element has a smaller area than that of the second surface of the inner volume of the first element.

20 Claims, 5 Drawing Sheets

PHOTOSENSITIVE CELL WITH LIGHT GUIDE

CROSS-REFERENCE TO RELATED APPLICATIONS

The present application is related to French Patent Application No. 0512155, filed Nov. 30, 2005, entitled "INTEGRATED CIRCUIT PROVIDED WITH AT LEAST ONE PHOTOSENSITIVE CELL COMPRISING A LIGHT GUIDE HAVING SEVERAL LEVELS AND CORRESPONDING FABRICATION PROCESS". French Patent Application No. 0512155 is assigned to the assignee of the present application and is hereby incorporated by reference into the present disclosure as if fully set forth herein. The present application hereby claims priority under 35 U.S.C. §119(a) to French Patent Application No. 0512155.

TECHNICAL FIELD

The present disclosure is generally directed to a photosensitive cell in an integrated circuit and, in particular, to integrated circuits having an optical element.

BACKGROUND

Many conventional optical components incorporate a photosensitive cell. For example, optical detectors typically include a single element, or cell, sensitive to the light incident on its entry face. As another example, optical detectors may be formed from a matrix of photosensitive cells that are juxtaposed alongside another. Thus, the respective entry faces lie in a common plane. The photosensitive cells are generally of small dimensions in order to obtain a sufficient spatial resolution. For example, the light entry face may have dimensions of approximately 5 $\mu m \times 5$ $\mu m$. Consequently, the quantity of light entering the photosensitive cell is limited by the size of the entry face.

The cells detect the light with a photosensitive element which may be based, for example, on CMOS technology. Thus, it is possible to convert the received light signal into an electrical signal. The photosensitive elements require at least one and often three metallization levels in order to connect them to the circuits that control them or that process their information. The metallization levels are formed from tracks that are generally made of copper and are isolated by dielectric layers. The metallization levels are formed between the photosensitive element and the light entry face of the cell. The dielectric materials used for isolating the tracks must therefore be transparent at the wavelengths detected by the photosensitive element. The light, however, is attenuated between the entry face and the photosensitive element especially when the number of metallization levels grouped into a multilayer increases.

To limit this attenuation, conventional methods produce an optical guide passing through the multilayer. In order to accomplish this, each multilayer level has a via. The vias are aligned and filled with a material whose refractive index is higher than the refractive indices of the materials forming the multilayer. It is, however, tricky to produce such a guide since it requires strict alignment of the constituent vias. If the vias are not aligned properly the guide could allow the photons initially propagating therein to escape. In addition, the photosensitive element is generally a surface portion of the semiconductor substrate, said surface portion being especially treated so as to fulfil this function. However, the surface of the substrate also includes, inside the cell, apart from the photosensitive element, electronic components needed for the operation of the photosensitive element.

The photosensitive element possesses a photosensitive surface of smaller area than the area of the entry face. For example, the dimensions of the photosensitive surface are 2 $\mu m \times 2$ $\mu m$ for an entry face measuring 5 $\mu m \times 5$ $\mu m$. Therefore, incident light in the form of a uniform beam directed approximately perpendicular to the entry face, and which illuminates the semiconductor substrate at the electronic components is lost. Thus, the light does not reach the photosensitive element and is substantially that part of the light which does not return to the optical guide. This loss reduces the sensitivity of the cell, particularly for low incident light intensities, compared with the theoretical sensitivity defined by the size of the entry face for light to enter the cell.

Some conventional methods provide a light guide by removing a part of the interconnection dielectric material and by depositing a material of high refractive index. This light guide has a frustoconical shape, the large cross section of which is located near the entry face and the small cross section of which is located near the photosensitive element. The element forming a light guide has the effect of concentrating the light entering via the large cross section onto the smaller surface of the photosensitive element. The production of such light guides involves the formation of a hole with a depth very much greater than its diameter, followed by the hole being filled with a material of high refractive index. This introduces, when filling the guide defects may cause light losses. In addition, as these defects are more numerous, the larger the height of the light guide.

Therefore, what is needed is an optical coupling element of high efficiency, whose efficiency depends little on the alignment defects of the various parts of the integrated circuit.

SUMMARY

The present disclosure is an optical coupling element of high efficiency, whose efficiency depends little on the alignment defects of the various parts of the integrated circuit.

In one embodiment, the present disclosure provides a photosensitive cell for use in an integrated circuit. The photosensitive cell includes an entry face, a photosensitive element and at least two light-guiding elements disposed between the entry face and the photosensitive element. The second one of the light-guiding elements is disposed between the first element and the entry face. Each of the light-guiding elements includes an inner volume having at least a first dielectric material and a first surface located on the same side as the photosensitive element. The light-guiding elements also include an outer volume having at least a second dielectric material with an optical refractive index lower than the refractive index of the first material. Additionally, the light-guiding elements include a second surface located on the same side as the entry face, the first surface of the inner volume of the second light-guiding element having a smaller area than that of the second surface of the inner volume of the first light-guiding element, wherein the first surface of the inner volume of the second element having a smaller area than that of the second surface of the inner volume of the first light-guiding element. The light-guiding elements further include a lateral surface joining said first surface to said second surface and separating the inner volume from the outer volume, the outer volume surrounding the inner volume over at least part of the lateral surface.

In another embodiment, the present disclosure provides a process for fabricating an integrated circuit having a photosensitive element and a first dielectric zone placed on the photosensitive element. The process includes forming a first hole from a portion of the surface of the first dielectric zone on the opposite side from the photosensitive element in the direction of the photosensitive element, over at least part of the thickness of the first dielectric zone, the bottom of the first hole having a smaller area than that of the aperture of the first hole. The process also includes filling the first hole with a material of higher refractive index than that of the material of the first dielectric zone in order to form a first light-guiding element having a first area located on the same side as the photosensitive element and a second surface on the opposite side from the photosensitive element. The process further includes depositing a second dielectric zone on the integrated circuit. The process still further includes forming a second hole from a portion of the surface of the second dielectric zone on the opposite side from the photosensitive element, over at least part of the thickness of the second dielectric zone, the bottom of the second hole having a smaller area than that of the second surface of the first light-guiding element. Finally, the process includes filling the second hole with a material of higher refractive index than that of the material of the second dielectric zone (205) in order to form a second light-guiding element.

In still another embodiment, the present disclosure provides an integrated circuit having an optical element. The optical element includes an entry face, a photosensitive element, and at least two light-guiding elements disposed between the entry face and the photosensitive element. The second one of the light-guiding elements is disposed between the first element and the entry face. Each of the light-guiding elements includes an inner volume having at least a first dielectric material and a first surface located on the same side as the photosensitive element. The light-guiding element also includes an outer volume having at least a second dielectric material with an optical refractive index lower than the refractive index of the first material. The light-guiding element further includes a second surface located on the same side as the entry face, the first surface of the inner volume of the second light-guiding element having a smaller area than that of the second surface of the inner volume of the first light-guiding element. The first surface of the inner volume of the second element has a smaller area than that of the second surface of the inner volume of the first light-guiding element. The light-guiding element still further includes a lateral surface joining said first surface to said second surface and separating the inner volume from the outer volume, the outer volume surrounding the inner volume over at least part of the lateral surface.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which:

FIG. 2 is a sectional view of a matrix formed from cells similar to those illustrated in FIG. 1a.

DETAILED DESCRIPTION

In one embodiment, the present disclosure provides an integrated circuit having a photosensitive cell. The photosensitive cell includes an entry face, a photosensitive element and at least two elements forming a light guide. The two elements are placed between the entry face and the photosensitive element. The second element is located between the first element and the entry face. The two elements guide the light coming from the entry face onto the photosensitive element. Each element forms a light guide having an inner volume that includes at least a first dielectric material and an outer volume that includes at least a second dielectric material. The optical refractive index of the second dielectric material is preferably lower than the refractive index of the first material.

Figure 1A:
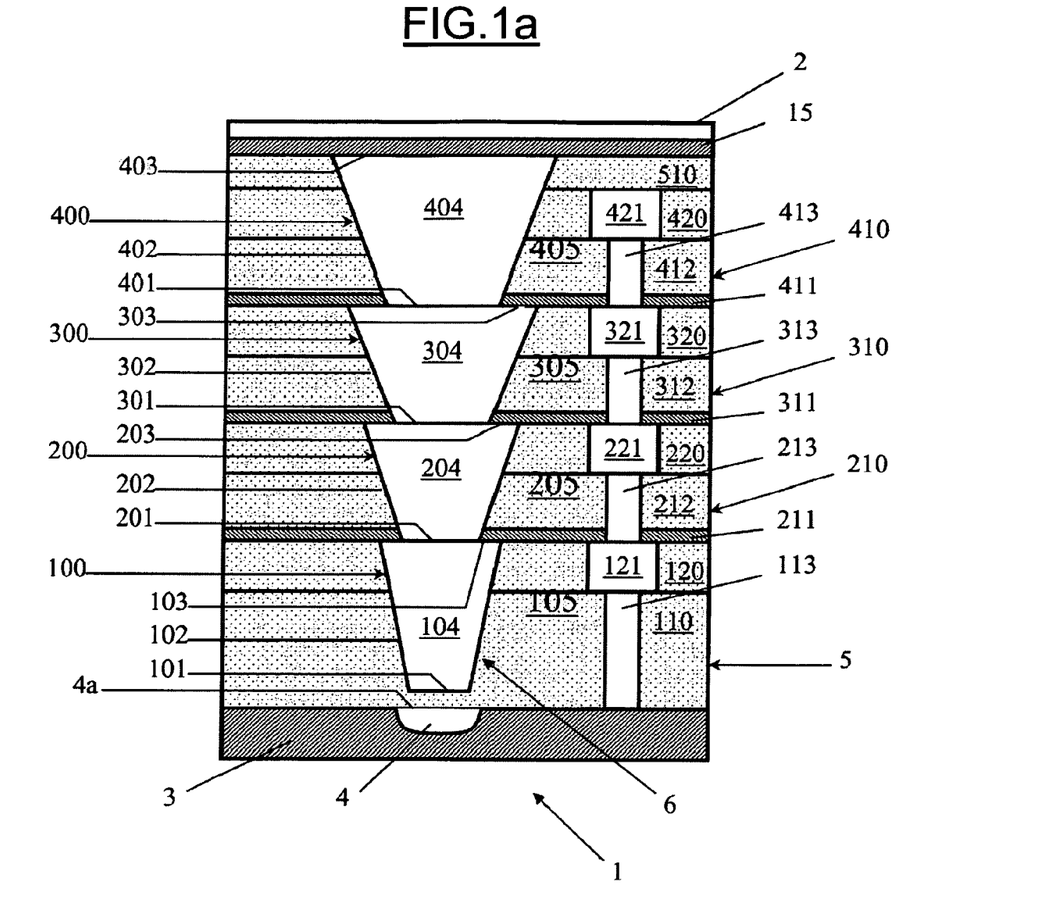
FIGS. 1a and 1b are sectional views of a photosensitive cell in a plane containing the axis of the cell.

In FIG. 1a, the photosensitive call 1 comprises, in its upper part, a transparent plate 2 forming the light entry face. The plate 2 may be a glass or transparent plastic plate. In a lower part of the cell 1, a semiconductor substrate 3, placed approximately parallel to the entry face, includes a photosensitive element 4, for example a photodiode, centered with respect to the axis of the cell and produced at least partly in the support. The photosensitive element 4 has an entry face 4a. The substrate may, for example be a silicon substrate.

The photosensitive cell 1 also includes an interconnection part 5 located between the semiconductor substrate 3 and the light entry face 2. In particular, the part 5 comprises several metallization layers 120, 220, 320 and 420. In the example shown, the interconnection part 5 comprises four metallization levels 120, 220, 320, 420. Two adjacent metallization levels are separated by a dielectric layer 210, 310, 410. The interconnection part 5 also includes a lower dielectric layer 110 and an upper dielectric layer 510 so that each metallization level 120, 220, 320, 420 is surrounded by a dielectric layer 110, 210, 310, 410, 510. Each dielectric layer 210, 310, 410 may include a thin stop sublayer 211, 311, 411 comprising silicon nitride and a thick sublayer 212, 312, 412 comprising silica.

In the example shown, a light guide 6 is placed between the entry face 2 and the photosensitive element 4. The light guide 6 comprises a plurality of elements in the form of cone frustums 100, 200, 300, 400, each defining an inner volume 104, 204, 304, 404 and an outer volume 105, 205, 305, 405. The cone frustums 100, 200, 300, 400 are superposed and positioned in such a way that their axes of symmetry coincide approximately with that of the cell. The cone frustums may have any cross section, for example, a square cross section.

Each cone frustum 100, 200, 300, 400 comprises a first surface 101, 201, 301, 401 and a second surface 103, 203, 303, 403 that are approximately parallel to the entry face and to the photosensitive element, and also a lateral surface 102, 202, 302, 402 that separates the inner volumes 104, 204, 304, 404 from the outer volumes 105, 205, 305, 405. The first surface 101, 201, 301, 401 is located on the same side as the photosensitive element and the second surface 103, 203, 303, 403 is located on the same side as the entry face. The first surface 101 of the element 100 has, for example, approximately the same area as the active face 4a of the photosensitive element 4. The second surface 403 of the element 400 has the largest possible area, for example slightly less than or even equal to the entry face 2.

The first surface 301 of the cone frustum 300 lies within the second surface 203 of the cone frustum 200 lying just below in the example shown in FIG. 1a. The second surface 203 of the cone frustum 200 located below has a larger area than that of the first surface 301 with which the surface 203 is in contact. In this way even if the cone frustums 200 and 300 are not perfectly aligned along their axis, the first surface 301 remains within the second surface 203 of the cone frustum placed below.

To reduce the footprint of the light guide 6 near the photosensitive element 4, the area of the second surface 103, 203, 303, 403 may progressively decrease in size the closer the corresponding cone frustum 100, 200, 300, 400 is to the photosensitive element 4.

The dielectric material forming the outer volumes 105, 205, 305, 405 comprises at least one of the materials chosen from the group formed by: silica ($SiO_2$), a fluorine-doped silicate glass (FSG) or a silicon, oxygen, carbon and nitrogen compound, represented by the formula $SiOC_xN_y$, where x and y may be zero, for example SiOC. These materials are chosen for their low optical refractive index within the wavelengths of visible light. The first dielectric material forming the inner volumes is advantageously a silicon, oxygen, carbon and nitrogen compound represented by the formula $SiOC_xN_y$, where x and y may be zero. Its optical refractive index may vary between 1.6 and 2.3 depending on the stoichiometry of its constituent elements. Alternatively, tantalum oxide may also be used as first dielectric material.

Figure 1B:
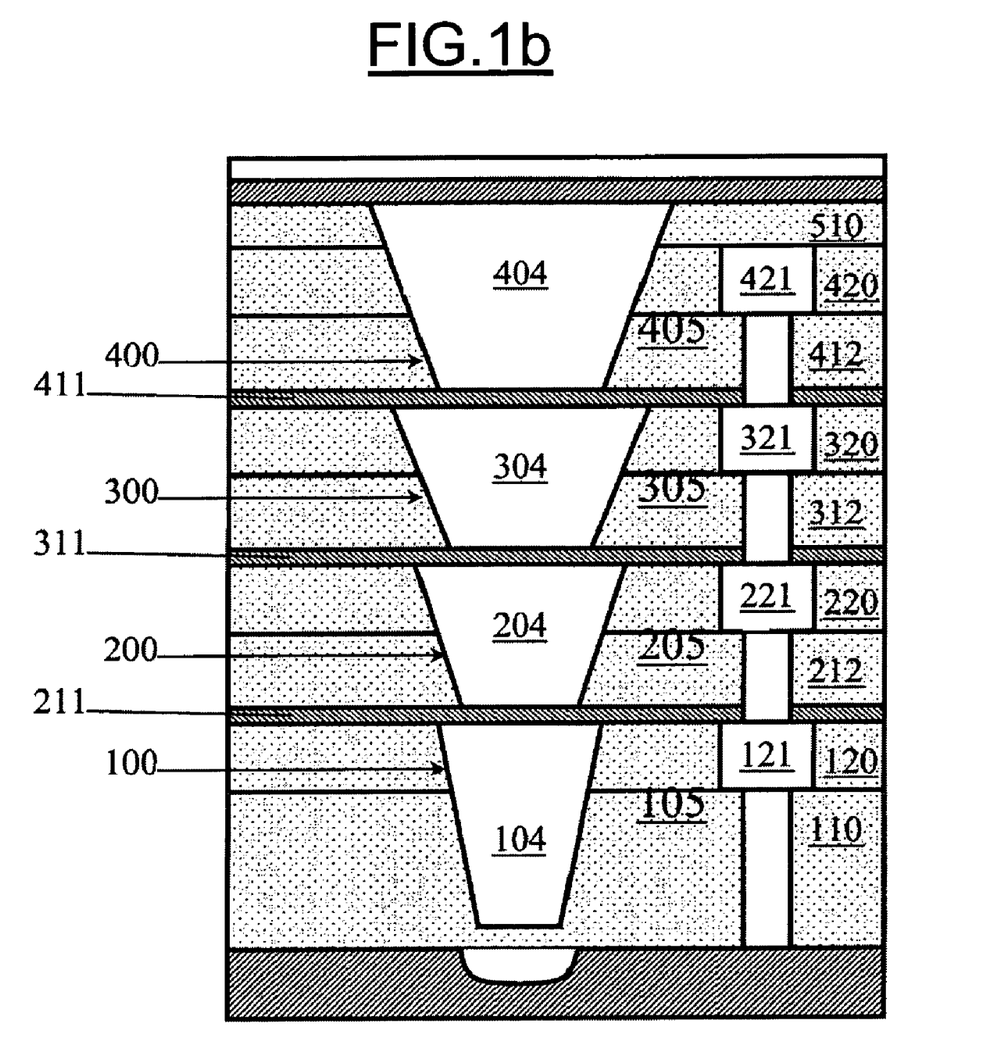

A second embodiment is shown in FIG. 1b. In this embodiment, the cone frustums 100, 200, 300, 400 forming the light guide 6 are separated by a thin layer 211, 311, 411. This layer may comprise silicon nitride and may serve as stop layer for the etching of the dielectric layer 212, 312, 412.

Figure 2:
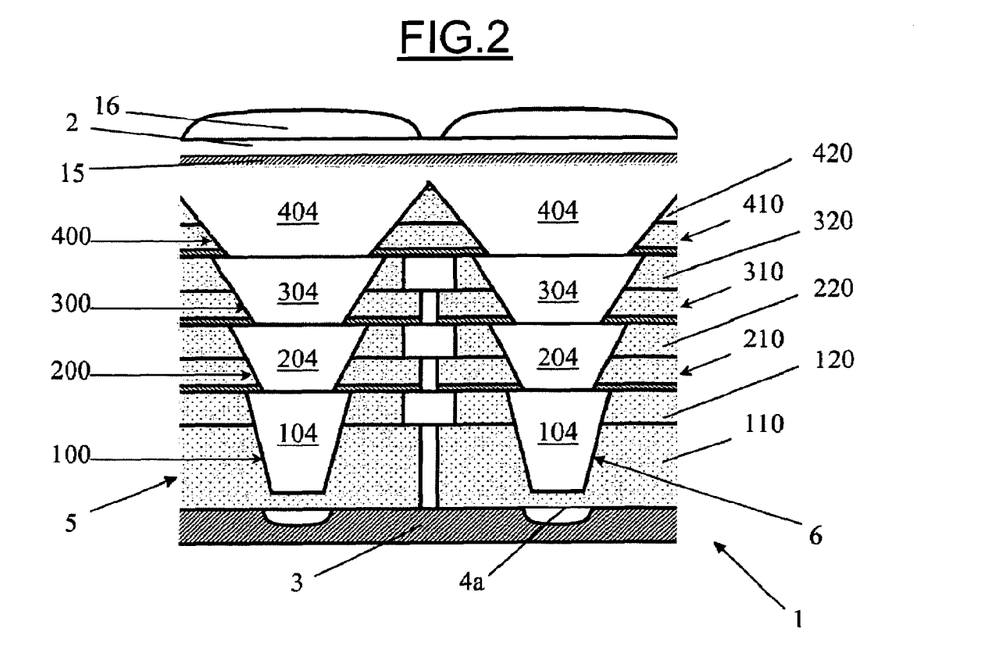

As illustrated in FIG. 2, a large number of photosensitive cells similar to the previous ones may be simultaneously produced on the surface of a large support. A two-dimensional matrix of photosensitive cells is therefore formed, each of them representing a pixel of the image obtained from this matrix. The cells 1 share the same semiconductor support 3 and the same transparent plate forming entry faces 2, as shown in FIG. 2. The respective entry faces 2 of the photosensitive cells 1 thus lie in a first common plane and the faces 4a of the respective photosensitive elements of the photosensitive cells 1 lie in a second common plane. Each cell 1 contains a light guide 6 composed of several elements 100, 200, 300, 400 as described above in the case of FIG. 1a.

The entry face 2 is continuous between two cells and transmits the light to the photosensitive cells 1 located beneath this entry face 2. The cells 1 are individually distinguished from one another by their light guide 6. The shape of each pixel is then determined by the upper surface of the light guide 6 of each photosensitive cell 1.

A color filter 15 associated with each cell 1 may also be placed at the entry face 2. The tuning wavelength of the filter, which defines the colour for an operational filter in incident visible light, may vary between two adjacent cells so as to provide a local distinction between the various chromatic components of the incident light.

A microlens 16 may also be placed on the entry face 2. Such a microlens 16 concentrates the incident light on the light guide and thus contributes to concentrating the incident light penetrating via the entry face 2 on to the photosensitive element 4. The fabrication and the arrangement of the microlenses 16 on the entry face 2 are carried out in a manner known per se.

Figure 3:
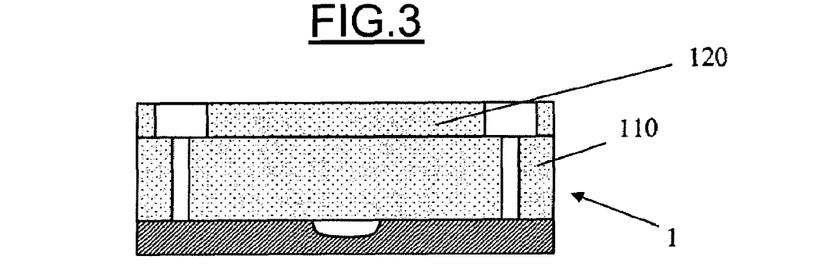
FIG. 3 illustrates a cell during fabrication once the first metallization level 120 has been formed on the dielectric layer.
Figure 4:
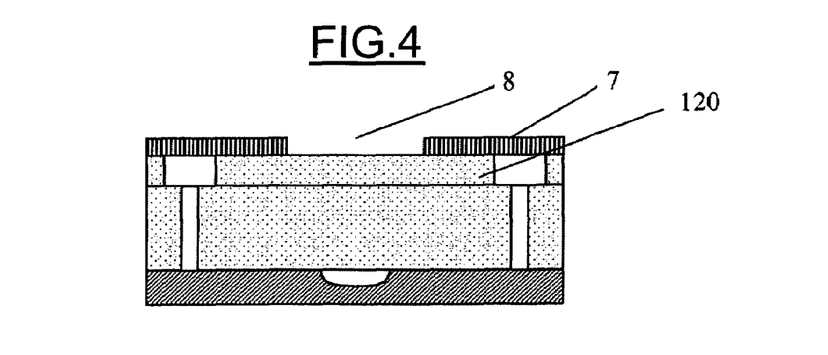
FIG. 4 illustrates a cell during fabrication after a resist layer has been irradiated onto a surface of the cone frustrum.

The inner volumes 104, 204, 304, 404 are formed in stages, alternating with the production of the various metallization levels 120, 220, 320, 420 and their associated dielectric layers 110, 210, 310, 410, 510, as illustrated in FIGS. 3 to 10. FIG. 3 shows a cell 1 during fabrication, once the first metallization level 120 has been formed on the dielectric layer 110. A resist layer 7 is then deposited over the entire surface of the layer 120, the resist then being irradiated at the location 8 of the second surface of the cone frustum to be produced. The cell shown in FIG. 4 is therefore obtained.

Figure 5:
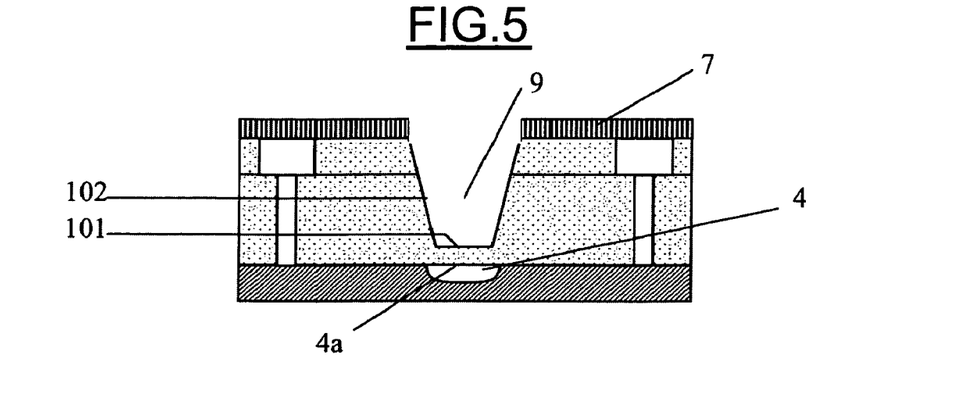
FIG. 5 illustrates a circuit obtained before the resist layer is removed.

Next, the integrated circuit undergoes a removal process at the point 8 where the resist was irradiated. One removal process is plasma-enhanced etching, especially using a "polymerizing plasma" so as to obtain a trench 9 whose lateral surface 102 decreases with depth. In addition, the reduction in the lateral surface 102 is chosen so that the bottom of the trench 101 has an area approximately equal to or smaller than that of the face 4a of the photosensitive element 4. The distance between the bottom of the trench 101 and the photosensitive element 4 may be chosen to be less than or about the characteristic size of the face 4a. The circuit obtained is shown in FIG. 5.

Figure 6:
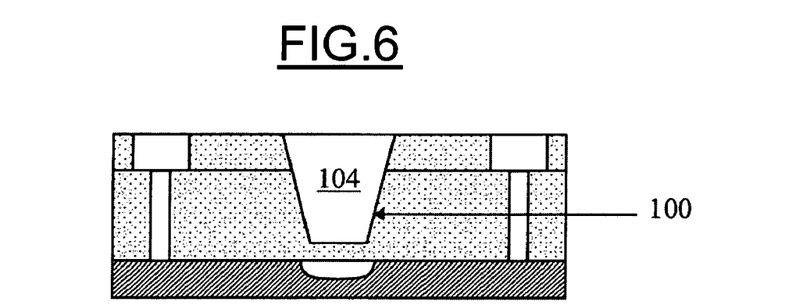
FIG. 6 illustrates a circuit obtained after excess dielectric material is removed.

The resist 7 is then removed from the unetched part of the upper surface of the cell by one or more standard processes and the first dielectric material is deposited, especially by PECVD (plasma-enhanced chemical vapor deposition). The gaseous chemicals used in this process may be chosen for simultaneously providing the oxygen, carbon, nitrogen, silicon and, optionally, fluorine elements. The gaseous chemicals are introduced in relative proportions resulting in the composition of the material deposited, which corresponds to the desired value of the optical refractive index to the first dielectric material. The excess first material is removed, for example, by abrasion. The circuit shown in FIG. 6 is obtained.

Figure 7:
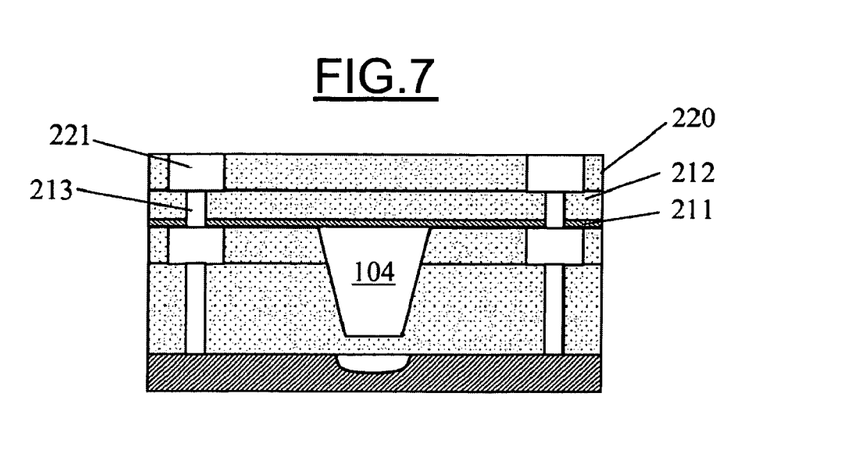
FIG. 7 illustrates an integrated circuit after the vias and conducting tracks are etched and filled by deposition.

Next, a second dielectric layer, comprising a silicon nitride sublayer 211 and a silica sublayer 212, followed by a second metal layer 220, are deposited. Vias 213 and conducting tracks 221 are then produced by etching and then filled by deposition. The integrated circuit obtained is shown in FIG. 7.

Figure 8:
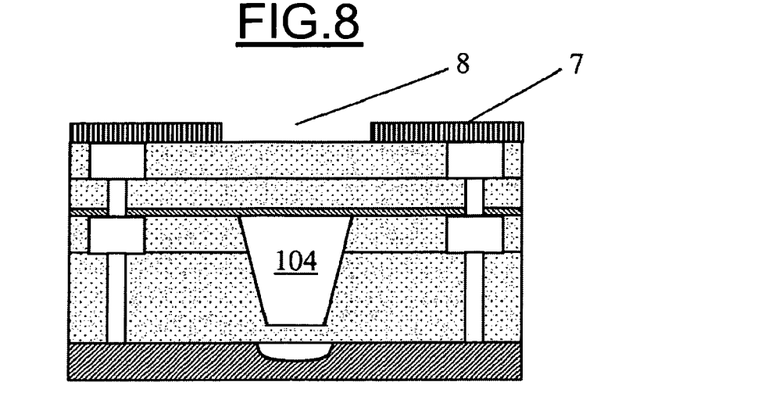
FIG. 8 illustrates a cell after a resist layer is deposited.
Figure 9:
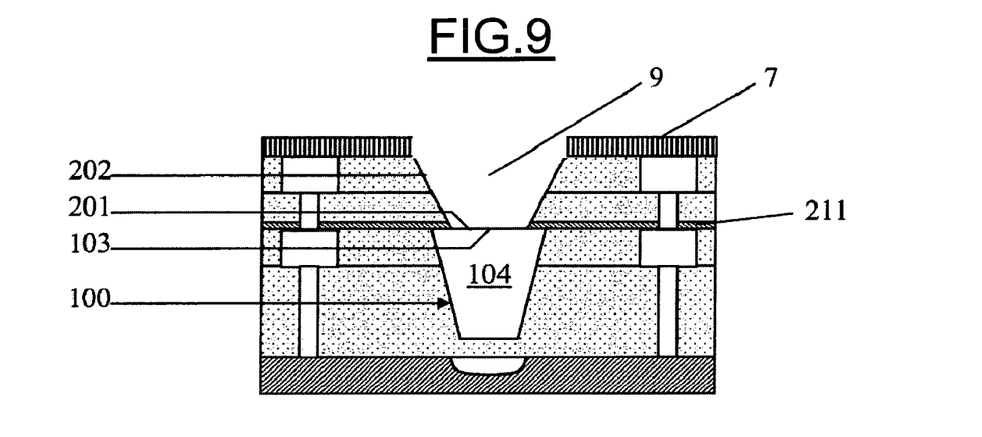
FIG. 9 illustrates a circuit after a stop sub-layer is etched.

A resist layer 7 is then deposited, which is then irradiated at the location 8 of the second surface of the cone frustum to be produced. The cell shown in FIG. 8 is therefore obtained.

Next, the integrated circuit undergoes a removal process at the point 8 where the resist 7 was irradiated, using a method similar to that mentioned above, until the stop sublayer 211 is reached. The slope of the lateral surface 202 is chosen so that the bottom 201 of the trench 9 has a smaller area than the second surface 103 of the element 100 of the light guide produced beforehand. The stop sublayer 211 may or may not be etched, depending on whether it is desired to produce the integrated circuit shown in FIG. 1a or that shown in FIG. 1b. If the stop sublayer 211 is etched, the circuit obtained is that shown in FIG. 9.

Figure 10:
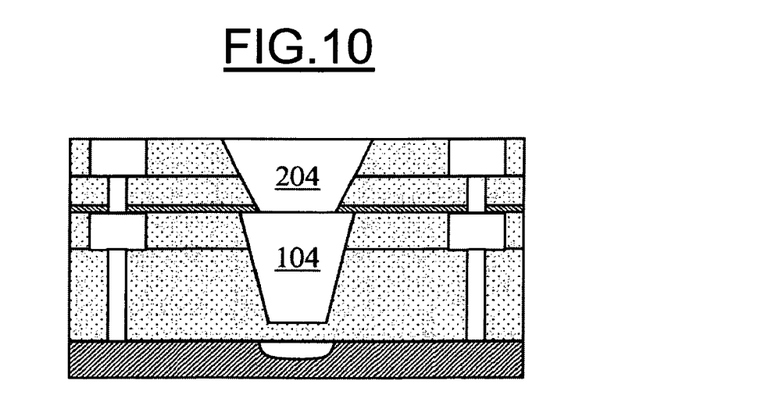
FIG. 10 illustrates a circuit after the excess first material deposited is removed.

The resist is removed from the unetched part of the upper surface of the cell by one or more standard processes. A layer of first dielectric material is then deposited as previously and the excess first material deposited is removed, for example, by abrasion. The circuit shown in FIG. 10 is obtained.

These steps are again repeated as many times as there are cone frustums in the light guide. Finally, the cell is completed in a conventional manner in order to obtain that illustrated in FIG. 1a.

The inner volume has a first surface located on the same side as the photosensitive element, a second surface located on the same side as the entry face, and a lateral surface joining said first surface to said second surface and separating the inner volume from the outer volume. The outer volume surrounds the inner volume over at least part of the lateral surface. The two elements of the light guide are disposed so that the first surface of the inner volume of the second element has a smaller area than that of the second surface of the inner volume of the first element.

In one embodiment, by producing a light guide as several internal volumes, each having a smaller height/diameter ratio, it is possible for the present disclosure to achieve better filling with the first material. The inner volume of each element of the guide is therefore more homogeneous, thus improving the optical behaviour of the guide. Moreover, the walls separating each inner and outer volume have a smoother surface finish, also promoting the performance of the guide. Finally, the guide has a lower sensitivity to variations in the slope of the lateral surfaces of the various elements thanks to the smaller thickness of said elements.

In another embodiment, the difference in area between the first surface of the second inner volume and the second surface of the first inner volume aids in preventing a slight misalignment during production of the various elements of the light guide. Such misalignments may impair the performance of the light guide.

In still another, embodiment the photosensitive element may be sensitive to visible, infrared and ultraviolet light. The optical refractive indices in question relate to the wavelength of the light for which the photosensitive cell is designed.

The entry face is approximately parallel to the surface of the semiconductor support for the sensitive element. The present disclosure may also be applied to other cell geometries in which the entry face is not parallel to the surface of the sensitive element.

The inner volume of each element of the light guide may be produced in such a way that the area of the second surface decreases when the element is of lower order. In other words, the element is closer to the photosensitive element. Thus, the inner volume of the element of the guide closest to the entry face may have a wide second surface to collect most of the light arriving on the entry face of the cell. The following elements of the guide are then each produced with a second, smaller, surface than that of the element closest to the entry face. This may, for example, be achieved by producing the inner volumes of each element of the guide with a first surface of small area. Thus, it is possible to reduce the space occupied by the light guide in the cell, without reducing its sensitivity. It is then easier to place electronic components in the cell, alongside the light guide.

The lateral surface of at least one inner volume may be a cone frustum according to one embodiment of the present disclosure.

The first surface of the inner volume of the second element is included within that of the second surface of the inner volume of the first element according to one embodiment of the present disclosure. The various elements of the light guide then form a single continuous volume. The light therefore passes through few interfaces during its propagation within the cell. Accordingly, it is possible to prevent reflections and parasitic losses and the light is guided more effectively.

In one embodiment according to the present disclosure, at least one inner volume is placed approximately in the thickness of a metallization level and of an associated dielectric layer. Each element of the light guide is produced before the metallization levels and the associated dielectric layers, which are further away from the photosensitive element. Accordingly, it is easier to carry out the fabrication process by producing each element of the light guide after part of the interconnection multilayer has been produced.

In another embodiment of the present disclosure relates to a photosensitive matrix having a plurality of photosensitive cells as defined above, in which matrix the respective entry faces of the photosensitive cells lie in one and the same first plane, and the surfaces of the respective photosensitive elements of the photosensitive cells lie in one and the same second plane. Some of these cells may also be produced in combination with a colour filter and/or with a convergent microlens.

In still another embodiment of the present disclosure provides a process for fabricating an integrated circuit comprising a photosensitive element and a first dielectric zone placed on the photosensitive element. The process includes the formation of a hole from a portion of the surface of the first dielectric zone on the opposite side from the photosensitive element, over at least part of the thickness of the first dielectric zone, the bottom of the hole having a smaller area than that of the aperture.

The process also includes the filling of the hole with a material of higher refractive index than that of the material of the first dielectric zone in order to form a first light-guiding element having a first area located on the same side as the photosensitive element and a second surface on the opposite side from the photosensitive element.

The process further includes the deposition of a second dielectric zone on the integrated circuit and the formation of a second hole from a portion of the surface of the second dielectric zone on the opposite side from the photosensitive element, over at least part of the thickness of the second dielectric zone, the bottom of the hole having a smaller area than that of the second surface of the first light-guiding element. Finally, the process includes filling the hole with a material of higher refractive index than that of the material of the second dielectric zone in order to form a second light-guiding element.

In one embodiment, the second hole is formed in the thickness of the second dielectric zone. In other words, the light guide includes a plurality of cone frustums. The cone frustums are placed in such a way that the light, coming from the entry face and directed towards the photosensitive element, passes in succession through them. The small section of each cone frustum, with the exception of that closest to the photosensitive element, is smaller than the adjacent large section of the neighbouring cone frustum placed on the same side as the photosensitive element. When the distance separating the two adjacent sections is larger, the difference in area may be greater. The arrangement of the various cone frustums and their geometry are chosen so that most of the rays leaving one cone frustum reach the entry face of the following cone frustum. This also takes into account the deviations and misalignments that may occur during production of the guide.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. For use in an integrated circuit, a photosensitive cell comprising:
   an entry face;
   a photosensitive element; and
   at least two light-guiding elements disposed between the entry face and the photosensitive element, wherein the second one of the light-guiding elements is disposed between the first element and the entry face, wherein each of the light-guiding elements comprises:
   an inner volume having at least a first dielectric material and a first surface located on the same side as the photosensitive element;
   an outer volume having at least a second dielectric material with an optical refractive index lower than the refractive index of the first material;
   a second surface located on the same side as the entry face, the first surface of the inner volume of the second light-guiding element having a smaller area than that of the second surface of the inner volume of the first light-guiding element; and
   a lateral surface joining said first surface to said second surface and separating the inner volume from the outer volume, the outer volume surrounding the inner volume over at least part of the lateral surface, wherein the first surface area of the second light guiding element is greater than the first surface area of the first light guiding element.

2. The photosensitive cell according to claim 1, wherein the lateral surface of at least one inner volume is a cone frustum.

3. The photosensitive cell according to claim 1, wherein the first surface of the inner volume of the second light-guiding element is disposed within that of the second surface of the inner volume of the first light-guiding element.

4. The photosensitive cell according to claim 1, wherein the first surface of the inner volume of the second light-guiding element is separated from the second surface of the inner volume of the first light-guiding element by a dielectric layer.

5. The photosensitive cell according to claim 1, wherein at least one inner volume is disposed approximately in a thickness of a metallization level and of an associated dielectric layer.

6. The photosensitive cell according to claim 1, wherein the second dielectric material comprises at least one material selected from the group consisting of: a silica, a fluorine-doped silicate glass (FSG), and a silicon, oxygen, carbon and nitrogen compound, represented by the formula SiOCxNy, where x and y may be zero.

7. The photosensitive cell according to claim 1, wherein the first dielectric material comprises a silicon, oxygen, carbon and nitrogen compound, represented by the formula SiOCxNy, where x and y may be zero.

8. The photosensitive cell according to claim 1 further comprising:
   a plurality of photosensitive cells arranged in a matrix, the respective entry faces of the photosensitive cells lying in one and the same first plane, and the faces of the respective photosensitive elements of the photosensitive cells lying in one and the same second plane.

9. The photosensitive cell according to claim 8, wherein at least one photosensitive cell includes a color filter on the opposite side from the photosensitive element.

10. The photosensitive cell according to claim 8, further comprising:
    at least one microlens on the opposite side from the photosensitive element.

11. An integrated circuit having an optical element, the optical element comprising:
    an entry face;
    a photosensitive element; and
    at least two light-guiding elements disposed between the entry face and the photosensitive element, wherein the second one of the light-guiding elements is disposed between the first element and the entry face, wherein each of the light-guiding elements comprises:
    an inner volume having at least a first dielectric material and a first surface located on the same side as the photosensitive element;
    an outer volume having at least a second dielectric material with an optical refractive index lower than the refractive index of the first material;
    a second surface located on the same side as the entry face, the first surface of the inner volume of the second light-guiding element having a smaller area than that of the second surface of the inner volume of the first light-guiding element; and
    a lateral surface joining said first surface to said second surface and separating the inner volume from the outer volume, the outer volume surrounding the inner volume over at least part of the lateral surface, wherein the first surface area of the first light guiding element is greater than the first surface area of the second light guiding element.

12. The optical element according to claim 11, wherein the lateral surface of at least one inner volume is a cone frustum.

13. The optical element according to claim 11, wherein the first surface of the inner volume of the second light-guiding element is disposed within that of the second surface of the inner volume of the first light-guiding element.

14. The optical element according to claim 11, wherein the first surface of the inner volume of the second light-guiding element is separated from the second surface of the inner volume of the first light-guiding element by a dielectric layer.

15. The optical element according to claim 11, wherein at least one inner volume is disposed approximately in the thickness of a metallization level and of an associated dielectric layer.

16. The optical element according to claim 11, wherein the second dielectric material comprises at least one material selected from the group consisting of: a silica, a fluorine-doped silicate glass (FSG), and a silicon, oxygen, carbon and nitrogen compound, represented by the formula SiOCxNy, where x and y may be zero.

17. The optical element according to claim 11, wherein the first dielectric material comprises a silicon, oxygen, carbon and nitrogen compound, represented by the formula SiOCxNy, where x and y may be zero.

18. The optical element according to claim 11 further comprising:
    a plurality of photosensitive cells arranged in a matrix, the respective entry faces of the photosensitive cells lying in one and the same first plane, and the faces of the respective photosensitive elements of the photosensitive cells lying in one and the same second plane.

19. The optical element according to claim 18, wherein at least one photosensitive cell includes a color filter on the opposite side from the photosensitive element.

20. The optical element according to claim 18, further comprising:

at least one microlens on the opposite side from the photosensitive element.

\* \* \* \* \*

UNITED STATES PATENT AND TRADEMARK OFFICE
CERTIFICATE OF CORRECTION

| | | |
|---|---|---|
| PATENT NO. | : 7,728,278 B2 | Page 1 of 1 |
| APPLICATION NO. | : 11/605847 | |
| DATED | : June 1, 2010 | |
| INVENTOR(S) | : Francois Roy et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 220 days.

Signed and Sealed this
First Day of March, 2011

David J. Kappos
*Director of the United States Patent and Trademark Office*